United States Patent [19]

Nishiyama

[11] Patent Number: 5,801,588
[45] Date of Patent: Sep. 1, 1998

[54] PREAMPLIFIER FOR OPTICAL COMMUNICATION

[75] Inventor: Naoki Nishiyama, Yokohama, Japan

[73] Assignee: Sumitomo Electric Industries, Ltd., Osaka, Japan

[21] Appl. No.: 804,185

[22] Filed: Feb. 21, 1997

[30] Foreign Application Priority Data

Feb. 23, 1996 [JP] Japan .................................. 8-036879
Mar. 25, 1996 [JP] Japan .................................. 8-068708

[51] Int. Cl.$^6$ ........................................................ H03F 3/08
[52] U.S. Cl. ............... 330/308; 250/214 A; 250/214 AG; 359/194
[58] Field of Search ................. 330/59, 308; 250/214 A, 250/214 AG; 359/189, 194

[56] References Cited

U.S. PATENT DOCUMENTS 5,302,911  4/1994  Miyashita ........................... 330/308 X

*Primary Examiner*—James B. Mullins
*Attorney, Agent, or Firm*—Cushman Darby & Cushman IP Group of Pillsbury Madison & Sutro LLP

[57] ABSTRACT

The photocurrent generated by a photodiode receiving light substantially flows through a feedback resistor when the incident light intensity is low. As the incident light intensity increases, the source and drain of a FET connected in parallel to the feedback resistor establish a conducting state therebetween, whereby the photocurrent is divided into a current flowing through the feedback resistor and a current flowing through the FET connected in parallel to the feedback resistor. Accordingly, transimpedance is equivalently lowered, while the feedback resistor is restrained from lowering the output potential. When the incident light intensity is further increased, a gate bias current flows into the gate of an input-stage FET of an amplifier, whereby the photocurrent is divided into the current flowing through the feedback resistor, the current flowing through the FET connected in parallel to the feedback resistor, and the gate bias current. Accordingly, the preamplifier can operate even under a larger optical input. Thus realized is a novel configuration of a preamplifier for optical communication, from which a stable operation is expected even when the power supply voltage is lowered and which can operate at a single power source voltage as well.

12 Claims, 13 Drawing Sheets

EMBODIMENT OF PRESENT INVENTION

Fig.2 EMBODIMENT OF PRESENT INVENTION

DEPENDENCE OF INPUT-STAGE FET(Q1) GATE POTENTIAL ON MEAN PHOTOCURRENT IN EMBODIMENT

PREAMPLIFIER FOR OPTICAL COMMUNICATION

BACKGROUND OF THE INVENTION

1. Field of the Invention

The present invention relates to a preamplifier for optical communication using a field effect transistor (also referred to as "FET" hereinbelow) and in particular, to a preamplifier for optical communication suitable for operation under a single low power supply voltage.

2. Related Background Art

Conventionally known preamplifiers for optical communication have used a depletion-type FET (referred to as "D-FET" hereinbelow) and have been operated at an operating power supply voltage of +5 V or −5.2 V or under multiple voltages with at least two operating power supplies.

For example, U.S. Pat. No. 5,363,064 discloses a preamplifier for optical communication using a D-FET, which favorably operates at an operating power supply voltage of +5 V.

Conventionally, the operating power supply voltage of +5 V has been used in TTL circuits, whereas that of −5.2 V has been used in ECL circuits. In a preamplifier for optical communication behind which a TTL or ECL circuit is used, it is preferable, as a light receiving system, that the same operating power supply be used for both the preamplifier and the logic circuit disposed therebehind. Accordingly, an operating power supply voltage of +5 V, −5.2 V, or the like has been used in the conventional preamplifier for optical communication.

Recently, in order to attain a high-speed operation or a low power consumption, an increasing number of logical circuits have been adopting +3.3 V as their operating power supply voltage.

SUMMARY OF THE INVENTION

It is an object of the present invention to provide a novel configuration of preamplifier for optical communication, from which a stable operation can be expected even when the power supply voltage is lowered and which can operate at a single power supply voltage as well.

The present invention provides a transimpedance preamplifier for optical communication, whose main component device is a FET having a current/voltage converting function by which a current signal generated at a light receiving device in response to an optical signal is converted into a voltage signal, wherein an enhancement-type FET (referred to as "E-FET" hereinbelow) is used as an input-stage FET (first FET), while its gate bias is such that part of the signal current output from the light receiving device when a large optical signal is incident thereon is caused to flow into the input-stage FET so as to reduce the gain of the amplifier stage. For this purpose, a source bias generator such as a diode for forwardly biasing the source terminal of the input-stage FET by +1 V or less is connected to the source terminal of the input-stage FET. When constituting the source bias generator by a diode, the level shift diode in an output source follower of the amplifier is provided in a single stage.

A gate leak current $I_g$ of the input-stage FET is represented by the following equation:

$$I_g = I_0\left(\exp\left[\frac{q \cdot V_{gs}}{kT}\right] - 1\right) \approx I_0\left(\exp\left[\frac{q \cdot V_{gs}}{kT}\right]\right)$$

where $I_0$ is a constant, q is the absolute value of electron charge, $V_{gs}$ is the voltage between the gate and the source of the input-stage FET, k is the Boltzmann constant, and T is the absolute temperature. In order to maintain the minimum receiving sensitivity, the gate leak current $I_g$ should not be greater than the value which is one-Rth of the gate current under a condition that the forward voltage is provided between the gate and the source.

Accordingly the maximum acceptable $V_{gsmax}$ is represented by the following equation:

$$V_{gsmax} = V_f - \left(\frac{kT}{q}\right) \cdot \ln R$$

where $V_f$ is the forward voltage and R is the constant determined by the input-stage FET.

When the input-stage FET is formed by the GaAs technology, $V_f$ is 0.63 V and R is 1,000 typically. Thus, in a condition of the room temperature, the maximum acceptable $V_{gsmax}$ is 0.45 V.

On the other hand, it is preferable for obtaining large mutual conductance that the $V_{gs}$ is not smaller than ((the threshold voltage $V_{th}$ of the input-stage FET which is GaAs E-FET) +0.2 V). Accordingly, the range of $$0 \leq V_{th} \leq 0.25$$

is the preferable range of the threshold voltage $V_{th}$ of the input-stage FET.

Also, a drain and a source of a FET are connected in parallel to a feedback resistor of the amplifier, and a control signal generated from the output signal of the amplifier is input into a gate of the FET such that a current is bypassed through the drain-source path of the FET when a large optical signal is input.

On the other hand, in order to keep the gain in the amplifier stage to a required level when a small optical signal is input, another FET in a cascade connection is inserted between the input-stage FET and a load circuit.

Gate bias condition $V_{gs}$ of the input-stage FET in the amplifier is determined by the output potential which is fed back through the feedback resistor and the source potential of the input-stage FET. When the input optical signal is zero or small, since the gate potential has been set to a level which may be slightly higher than the source potential, the optical signal current from the light receiving device does not substantially flow into the gate but flows mostly into the output through the feedback resistor and a gate current $I_g$ of the input-stage FET is not more than 5 μA. Here, since the operating point of the input-stage FET is in a saturation region, the same voltage gain as that set by the cascaded FET can be obtained.

As the optical signal increases, the output potential decreases. In response to this decrease, the gate potential of the FET inserted in parallel to the feedback resistor increases. Consequently, the current is bypassed through the drain-source path of the FET, whereby the transimpedance value equivalently decreases. As a result, the feedback amount becomes greater, thereby restraining the output of the amplifier from being saturated.

As the optical input further increases, the signal current from the light receiving device becomes greater, while the gate potential of the input-stage FET correspondingly increases. On the other hand, since the source potential is fixed because the forward potential of the diode is almostly unchanged, the gate bias voltage $V_{gs}$ gradually increases. Since the gate-source path of the FET is equivalently considered to be a diode connected forward, the gate bias current finally begins to flow as a forward current of the diode. Thus, the optical signal current is divided into the currents respectively flowing through the feedback resistor and the drain-source path of the FET connected in parallel thereto and the gate bias current. When the optical signal becomes larger so as to increase the signal current, most of this increase flows as the bias current for the input-stage FET, whereby the current flows to the output through the feedback resistor is restrained from increasing. Under such a condition, the operating point of the input FET is not in the saturation region but in a linear region, whereby transconductance $G_m$ decreases at the same time.

On the other hand, a current/voltage converting characteristic of the amplifier is given by the current value flowing through the feedback resistor is multiplied by the feedback resistance value. First, the converting gain decreases when the current flows through the :FET connected in parallel to the feedback resistor. Then, when part of the signal current flows into the input-stage FET, the amplification gain of the, input-stage FET decreases, thereby lowering the open-loop gain of the amplifier. As a result, the output of the preamplifier can be restrained from being saturated, thereby securing a wide dynamic range.

In the preamplifier for optical communication in accordance with the present invention, between the input-stage FET for amplification and a load circuit, a second FET having a drain, a source, and a gate respectively connected in series to the load circuit, the drain of the input-stage FET for amplification, and a fixed bias applied thereto may be provided, whereby the fact that transfer conductance ($G_m$) and drain conductance ($G_D$) of thus serially connected FET depend on its source-drain voltage $V_{DS}$ can be used to dynamically control the voltage gain of the preamplifier.

In general, drain current characteristics of FETs can be divided into those in linear and saturation regions depending on their gate bias conditions, while $G_m$ and $G_D$ in one region greatly differ from those in the other region. Accordingly, the voltage gain of the amplifier constituted by FETs connected seriously can be changed greatly because the operating condition of the FET connected the source to the drain of the other FET shifts between these two regions in response of the light input or not.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of thee invention, are given by way of illustration only, since various changes and modifications within the spirit and scope of the invention will be apparent to those skilled in the art from this detailed description.

DESCRIPTION OF THE PREFERRED EMBODIMENTS

In the following, embodiments of the present invention will be explained with reference to attached drawings.

Before representing detailed embodiments, the summary of the preamplifier in accordance with these embodiments will be explained.

Figure 1:
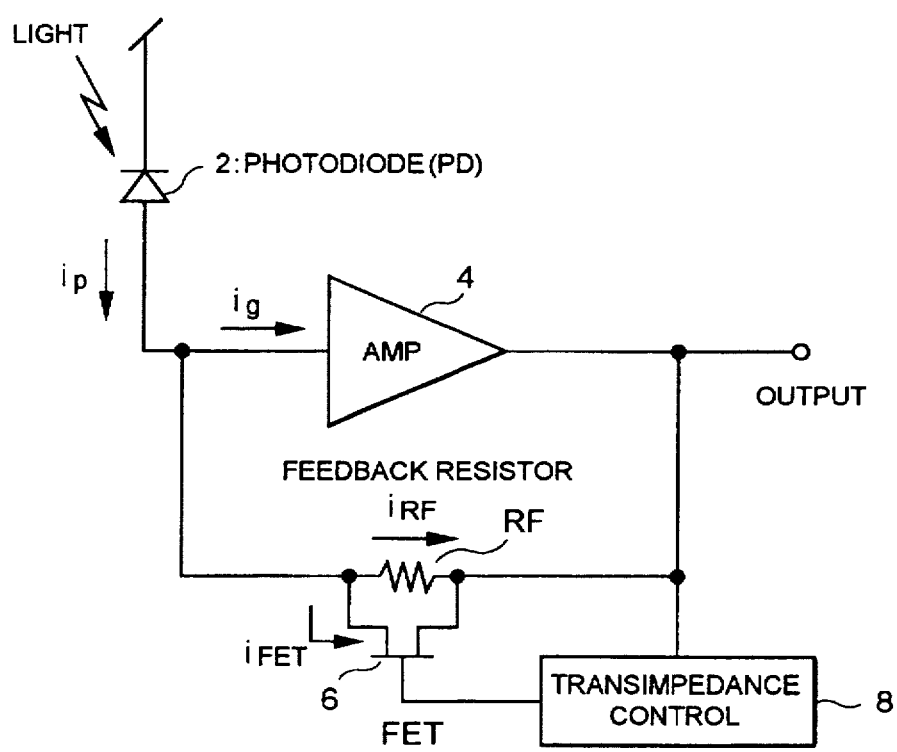
FIG. 1 is a block diagram showing an embodiment of the preamplifier for optical communication in accordance with the present invention.

FIG. 1 is a block diagram of a circuit in accordance with such embodiments. This circuit is a preamplifier for optical communication constituted by a photodiode (referred to as "PD" hereinbelow) 2, an amplifier 4, a feedback resistor RF, a parallel FET 6, and a transimpedance control circuit 8. As shown in FIG. 1, a photocurrent $i_p$, which is generated by the photodiode (PD) 2 when it receives light, mostly becomes $i_{RF}$ flowing through the feedback resistor RF when the incident light intensity is low. As the incident light intensity increases, the source and drain of the FET 6 connected in parallel to the feedback resistor RF establish a conducting state therebetween, In this state, $i_p$ is divided into $i_{RF}$ and $i_{FET}$, thereby equivalently lowering transimpedance, while restraining the feedback resistor RF from lowering the output potential.

When the incident light intensity further increases, a gate bias current flows into the gate of an input-stage FET of the amplifier 4, so as to divide the photocurrent $i_p$ into $i_{RF}$, $i_{FET}$, and $i_g$, whereby the preamplifier can operate under a larger optical input.

As explained in the foregoing, in a transimpedance preamplifier for optical communication, when part of the optical signal current from a light receiving device is caused to flow into a FET which is in parallel with a feedback resistor or into a gate of an input-stage FET, transimpedance can be equivalently lowered, while voltage gain can be suppressed, thereby enabling a wide dynamic range to be obtained.

(First Embodiment)

Figure 2:
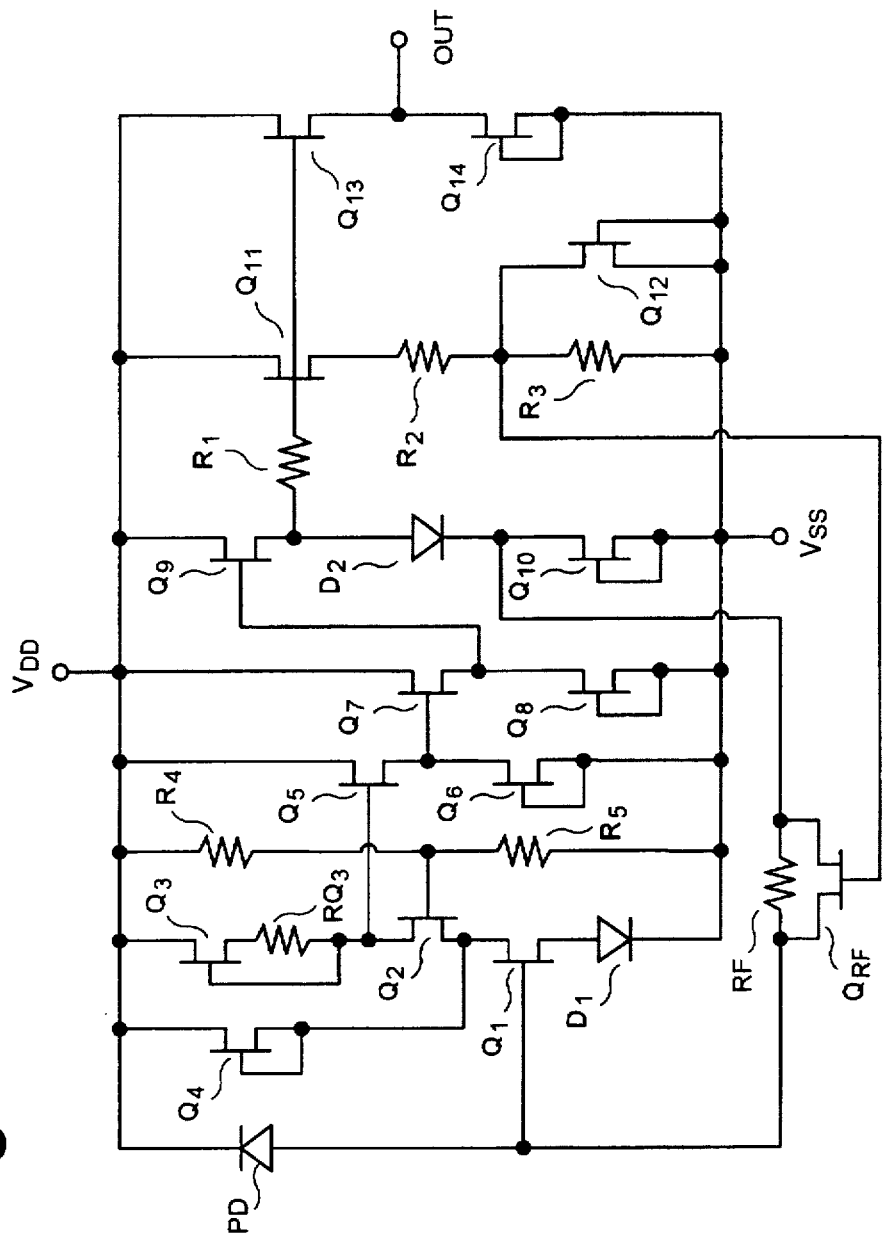
FIG. 2 is a circuit diagram showing the embodiment of the preamplifier for optical communication in accordance with the present invention.

FIG. 2 shows a circuit diagram of the preamplifier for optical communication in accordance with a first embodiment of the present invention. In this embodiment, a MESFET mainly composed of GaAs is used as field effect transistors. In addition, an implant resistor monolithically formed on a GaAs substrate by means of ion implantation and a GaAs Schottky barrier diode are used. Here, as the MESFET mainly composed of GaAs, two kinds of FETs, i.e., an E-FET having a threshold voltage of +50 mV and a D-FET having a threshold voltage of −400 mV, are used.

In the circuit shown in FIG. 2, as FETs constituting the amplifier stage of the preamplifier, an E-FET having a gate width of 120 µm and a gate length of 0.5 µm is used as $Q_1$; while D-FETs having gate widths of 50 µm, 10 µm, and 60 µm with a gate length of 0.8 µm are respectively used as $Q_2$, $Q_3$, and $Q_4$. In this circuit, the gate widths of $Q_2$, $Q_3$, and $Q_4$ are set such that the gate bias voltage $V_{gs}$ of $Q_1$ becomes +0.35 V when there is no signal. Here, a resistor of 1 $k^{106}$ is inserted between the source and gate of $Q_3$ so as to apply a bias voltage to the gate.

Also, the feedback resistor RF is set to 20 $k^{106}$, while a FET $Q_{RF}$ having a width of 50 µm is connected in parallel thereto. The gate potential of $Q_{RF}$ is controlled by an output signal from a transimpedance control circuit comprising $Q_{11}$, $Q_{12}$, $R_1$, $R_2$, and $R_3$.

Figure 3:
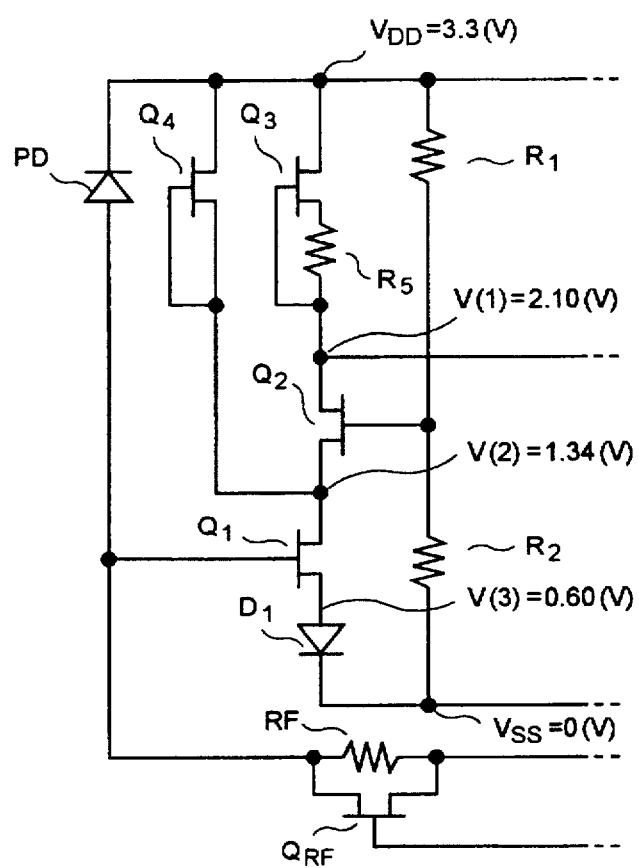
FIG. 3 is a circuit diagram showing, under magnification, an amplifier stage portion of the preamplifier shown in FIG. 2.

In this embodiment, the amplifier stage is constituted by three FETs ($Q_1$, $Q_2$, and $Q_3$) which are cascaded to each other. FIG. 3 is an enlarged view of this amplifier stage.

Assuming that transfer conductance and drain conductance of each of the FETs ($Q_1$ to $Q_3$) are respectively $G_m(n)$ and $G_D(M)$, voltage gain $A_V$ of the amplifier stage in this circuit configuration is given by:

$$A_V = G_m(1)/(G_D(3)+G_D(1))*\{[G_D((2)+G_D(3)]/[G_m(2)+G_D(2)]\}) \quad (1)$$

Here, in the operation of $Q_2$, the source potential decreases since $V_{DS}$ of $Q_1$ becomes smaller in response to the optical input, while gate bias $V_{GS}$ increases since the gate potential is fixed. On the other hand, since the current flowing into this circuit is determined by $Q_4$ whose gate-source path is short-circuited, $V_{DS}$ decreases in response to the optical input so as to compensate for the increase in gate bias of $Q_2$. Accordingly, $G_m(2)$ and $G_D(2)$ in the above expression can be changed, whereby the voltage gain $A_V$ in the whole circuit can be changed dynamically.

Assuming that the drain-source voltage of $Q_2$ with no optical input is $V_{DS(O)}$, the output potential decreases by $\Delta V_{OUT}$ when there is an optical input, i.e., when the gate of Q, shifts in the positive direction. When the value of $V_{DS(O)} - \Delta V_{OUT}$ enters the linear region in the drain current characteristic of $Q_2$, the transfer conductance $G_m(2)$ decreases, while the drain conductance $G_D(2)$ increases, whereby the voltage gain $A_V$ can be lowered in accordance with the above expression.

Figure 4:
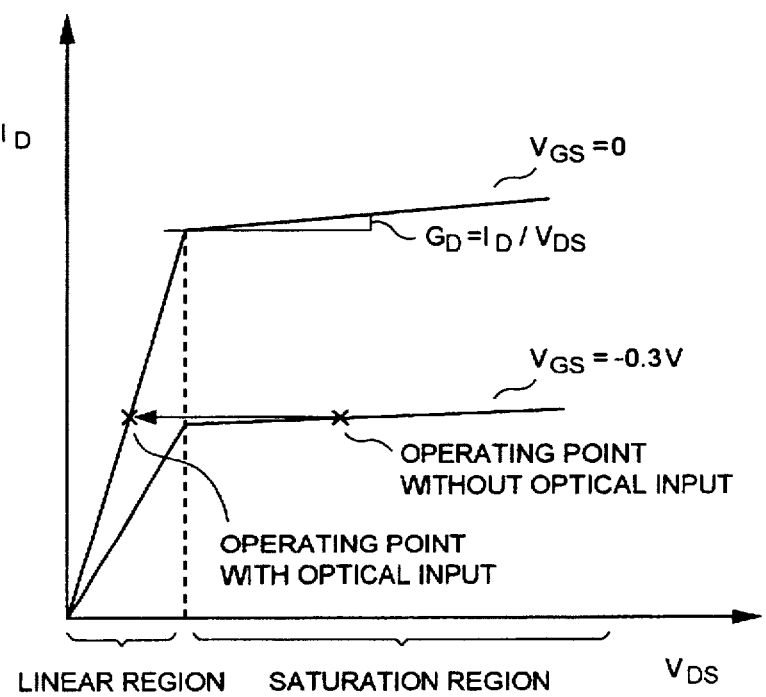
FIG. 4 is a chart showing a drain current/voltage characteristic of a FET for explaining the fact that the operating point moves depending on whether light is input or not, thereby changing $G_D$.

FIG. 4 shows a relationship between a drain current of a FET and its source-drain voltage.

A power supply voltage $V_{DD}$ is supplied as being divided by $R_1$ ($660^{106}$) and $R_5$ ($340^\Omega$) to $Q_2$, which is inserted between the source of $Q_3$ and the drain of $Q_1$ with its gate grounded, such that the source-drain voltage $V_{DS}$ of $Q_2$ resides in the saturation region in the case of a small optical input, while it enters the linear region (proportional region) when the voltage gain is lowered in the case of a large optical input. Also, the FET $Q_{RF}$ is connected in parallel to the feedback resistor RF such that, in the case of a large optical input, the gate bias of $Q_{RF}$ is changed in response to the signal intensity thereof so as to reduce the equivalent transimpedance.

Figure 5:
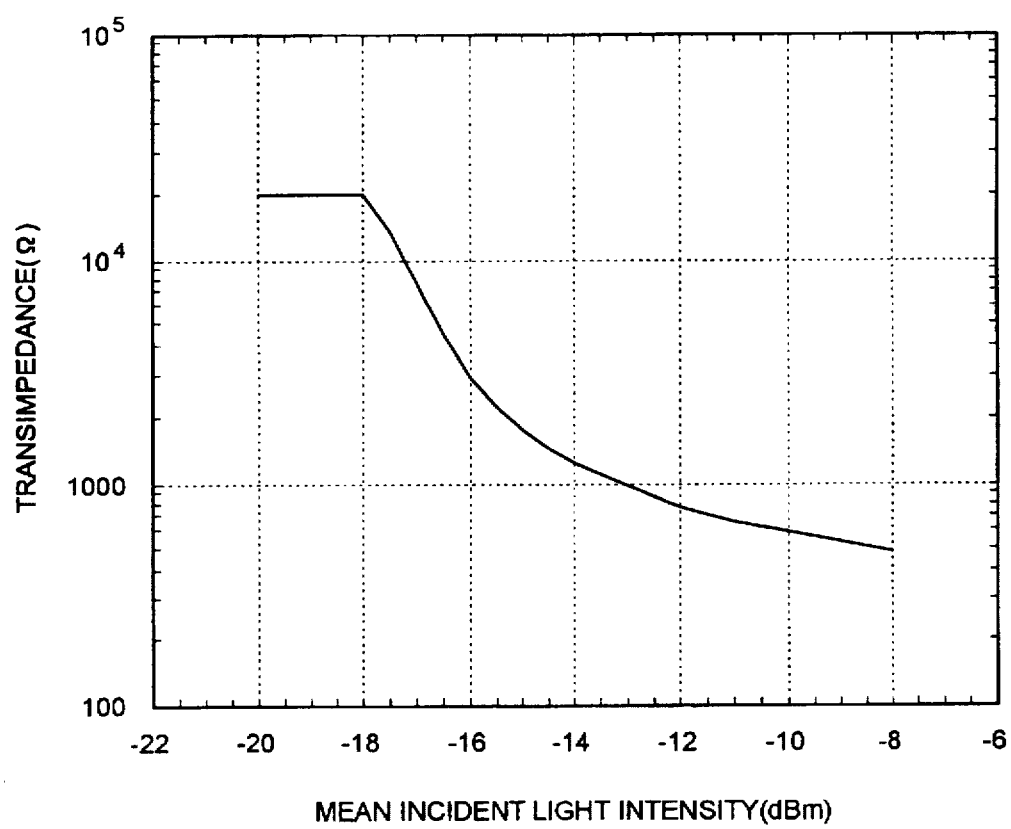
FIG. 5 is a chart showing the dependence of transimpedance on optical intensity in the embodiment of the present invention.

FIG. 5 shows how transimpedance changes when a signal with a duty cycle of 50% is input into this circuit. Transimpedance is constant at 20 $k^{106}$ before the mean incident light intensity reaches −18 dBm, and the former begins to decrease after the latter exceeds −18 dBm. When a signal with a duty cycle of 50% is input at a mean incident light intensity of −21 dBm, the output amplitude in the source of $Q_3$ corresponds to the mean incident light intensity of −21 dBm=7.9 µW, whereby the peak incident light intensity becomes 7.9 µW×2=15.8 µW. Assuming that the sensitivity of the photodiode PD is 0.8 (A/W) and that the transimpedance is 20 $k^\Omega$, the output voltage amplitude of the amplifier is obtained from (incident light intensity)×(sensitivity of PD)×(transimpedance) as 15.8 (µm)×0.8 (Ω/W)×20 (kΩ)= 0.253 (V). Namely, when light of −18 dBm is incident on the circuit, the output potential thereof decreases by 0.253 V as compared with the case in which no light is incident thereon. In the circuit shown in FIG. 3, this decrease is substantially caused by the increase in $V_{DS}$ of $Q_3$ and decrease in $V_{DS}$ of $Q_2$, i.e., changes in operating points of load devices $Q_1$ and $Q_2$ in the amplifier-stage FETs.

In this circuit, the transition voltage from the proportional region to the saturation region in the drain current: characteristic of $Q_2$, which is a D-FET, is about 0.5 V. Accordingly, when the ratio between $R_1$ and $R_2$ determining the gate bias of $Q_2$ is adjusted so as to set the source-drain voltage $V_{DS}$ of $Q_2$ to 0.5+0.253=0.753 V, the operating point of $Q_2$ resides in the saturation region in the range where the mean incident light intensity is lower than −21 dBm. In this case, in the above expression (1), the ratio $G_m(2)/G_D(2)$ of the transfer conductance $G_m(2)$ to the drain conductance $G_D(2)$ can be set to a high level, whereby the voltage gain of the preamplifier is not lowered. On the other hand, when the peak light input intensity is higher than −18 dBm, the $V_{DS}$ of $Q_2$ becomes smaller than the transition voltage from the proportional region to the saturation region, whereby the ratio of the transfer conductance $G_m(2)$ to the drain conductance $G_D(2)$ becomes small, allowing the voltage gain to decrease.

Here, the preamplifier shown in this embodiment is set so as to operate at a power supply voltage of 3.3 V, while $Q_4$ is a current source FET for supplying a drain bias current to $Q_1$, which is disposed in order to adjust the gate bias of $Q_1$.

Figure 6:
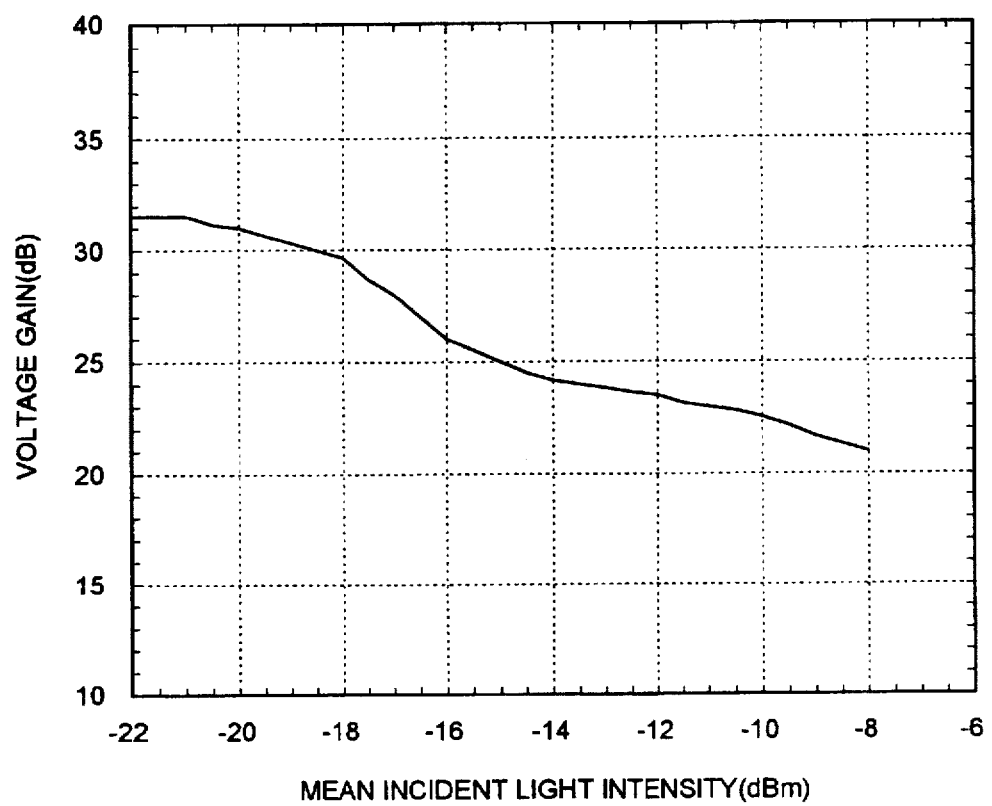
FIG. 6 is a chart showing the dependence of voltage gain on optical intensity in the embodiment of the present invention.

FIG. 6 shows results obtained when the dependence of the voltage gain of thus prepared preamplifier on incident light intensity is measured. When the incident light intensity is higher than −18 dBm, the voltage gain begins to decrease remarkably. This is due to the fact that the source-drain voltage $V_{DS}$ of $Q_2$ becomes smaller than the transition voltage from the proportional region to the saturation region, so as to lower the transfer conductance $G_m(2)$ and increase the drain conductance $G_D(2)$, thereby lowering the voltage gain of the amplifier.

Figure 7:
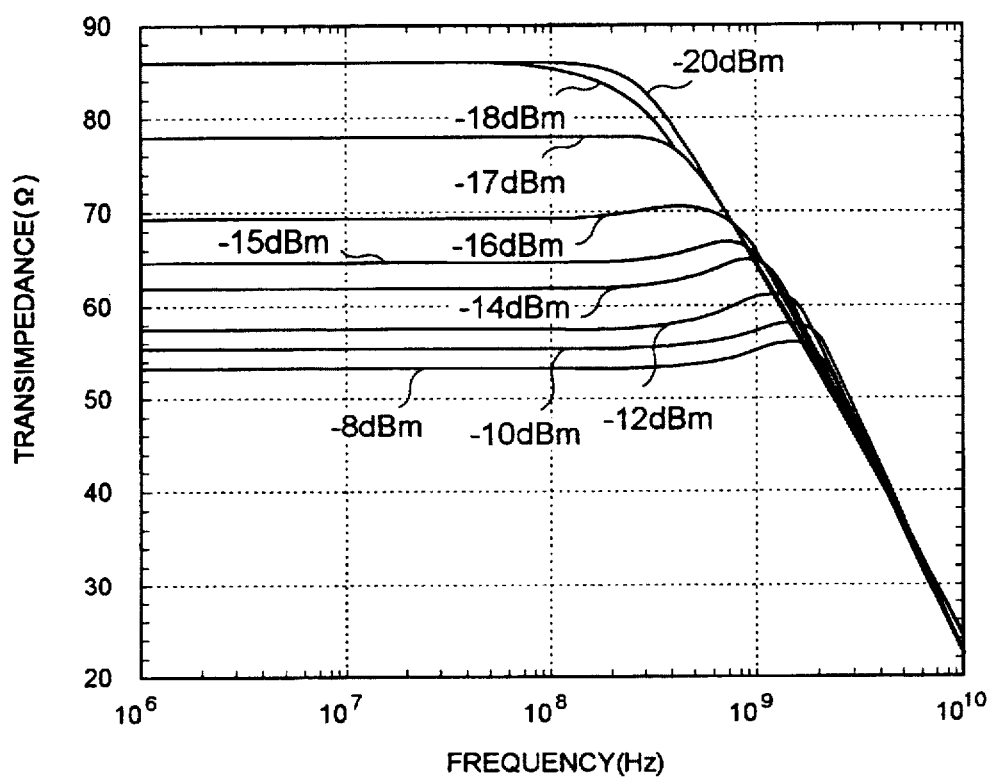
FIG. 7 is a chart showing the dependence of frequency characteristic of transimpedance on optical intensity in the embodiment of the present invention.
Figure 8:
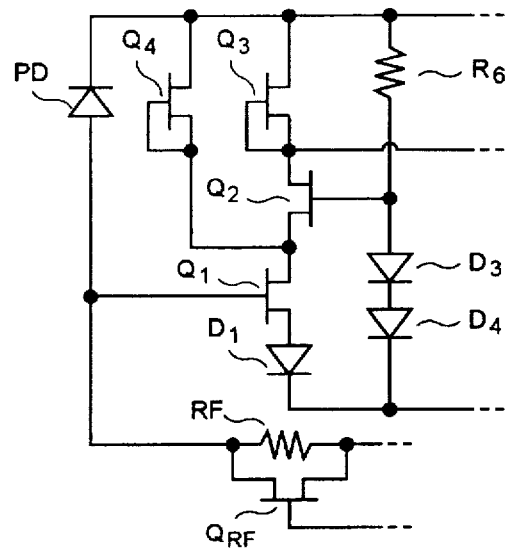
FIGS. 8 to 11 are circuit diagrams respectively showing, under magnification, modified examples of the amplifier stage portion of the preamplifier in accordance with the present invention.
Figure 9:
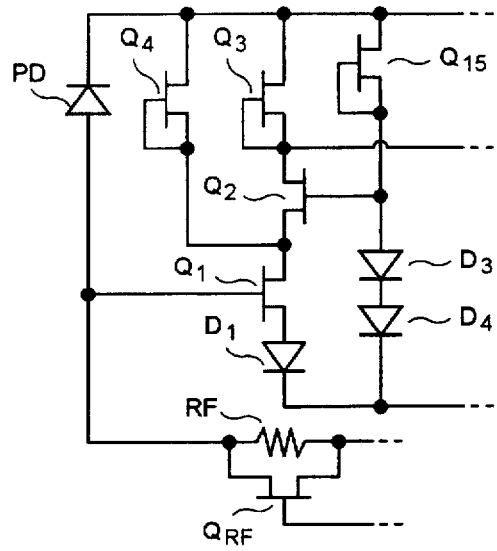
Figure 10:
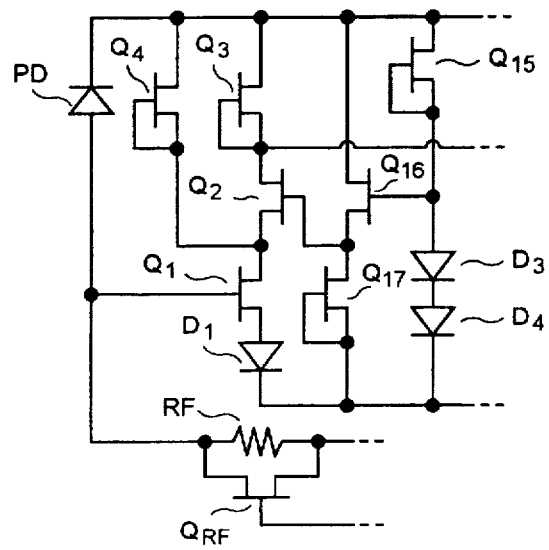
Figure 11:
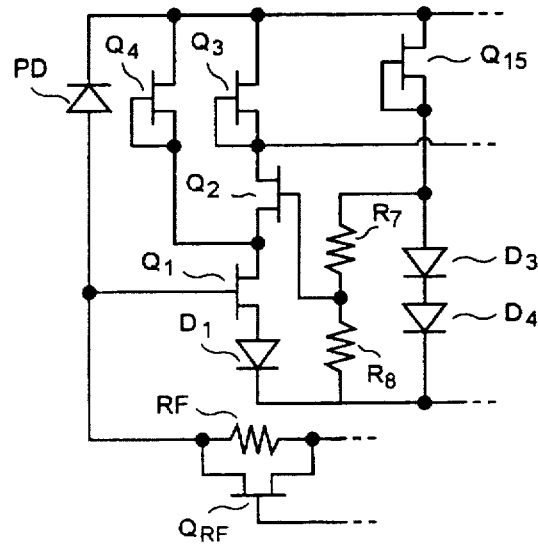

FIG. 7 evaluates the dependence of frequency characteristic of the preamplifier in this embodiment on optical intensity. In this chart, though transimpedance decreases as the input light intensity increases, the peak observed in the frequency characteristic is held within the range of 3 dB. This is due to the fact that, while transimpedance decreases in a region in which the incident light intensity is higher than −18 dBm (or the peak light intensity at a mean incident light intensity of −21 dBm in the case of a signal with a duty cycle of 50%), the voltage gain decreases in response thereto, whereby the peak is restrained from being generated, without increasing the bandwidth of the amplifier.

Though this embodiment adopts a configuration in which the gate bias of $Q_2$ is provided by $R_1$ and $R_2$, circuits such as those shown in FIGS. 8 to 11 may be used alternatively. Each of these circuits has a configuration which is much simpler than the configuration conventionally used in general in which a FET is connected in parallel to a load FET and, in order to control the gate bias of the former FET, as many as 10 pieces of circuit devices are necessary. Accordingly, the influence of fluctuation in process (fluctuation in manufacturing steps) and the like can be suppressed to a lower level.

While an InGaAs photodiode was used as the light receiving device, an optical receiver using the preamplifier of this embodiment was manufactured and evaluated. The light receiving surface of the photodiode has a diameter of 100 μm and outputs a current corresponding to an optical signal in the band of 1.3 μm. The sensitivity of the photodiode including the coupling efficiency thereof was 0.80 A/W.

When the preamplifier shown in FIG. 2 was operated at a power supply voltage $V_{DD}$ of +3.3 V, the preamplifier realized a voltage gain of 32 dB and a band of 550 MHz, which was equivalent to that of a conventional amplifier using only D-FETs and being operated at a power supply voltage of +5.0 V or −5.2 V. Further, it was confirmed that this preamplifier could operate even when the power supply voltage $V_{DD}$ was as low as 2.8 V. Also, the optical receiver showed a transimpedance of 19 $k\Omega$ and a transimpedance band of 180 MHz.

In the preamplifier in accordance with the present invention, in a region where the incident light intensity is −30 dBm or lower, the current flowing into the gate of $Q_1$ is 0.35 μA at 25° C. and about 1.5 μA even at 100° C. Namely, in this region, the gate current does not substantially flow. Accordingly, the influence of a shot noise on the minimum receiving sensitivity of the preamplifier is small. When a signal rate of 155.52 Mbps was used to evaluate this receiver, assuming that an optical input providing an error rate of $1\times10^{-10}$ was defined as the sensitivity thereof, a sensitivity of −36.5 dBm was obtained.

Also, as the incident light intensity is gradually increased, $Q_{RF}$ connected in parallel to the feedback resistor RF is turned on when the incident light intensity becomes about −18 dBm (or the mean incident light intensity of −21 dBm in the case of a modulated signal with a duty cycle of 50%) or greater, whereby transimpedance begins to decrease. Further, when the incident light intensity is higher than +1 dBm (or the mean incident light intensity of −2 dBm in the case of a modulated signal with a duty cycle of 50%), the whole photocurrent cannot be caused to flow through $Q_{RF}$ alone which is connected in parallel to the feedback resistor RF. Consequently, the gate potential of $Q_1$ begins to increase, and the photocurrent begins to flow into the gate of $Q_1$.

Figure 12:
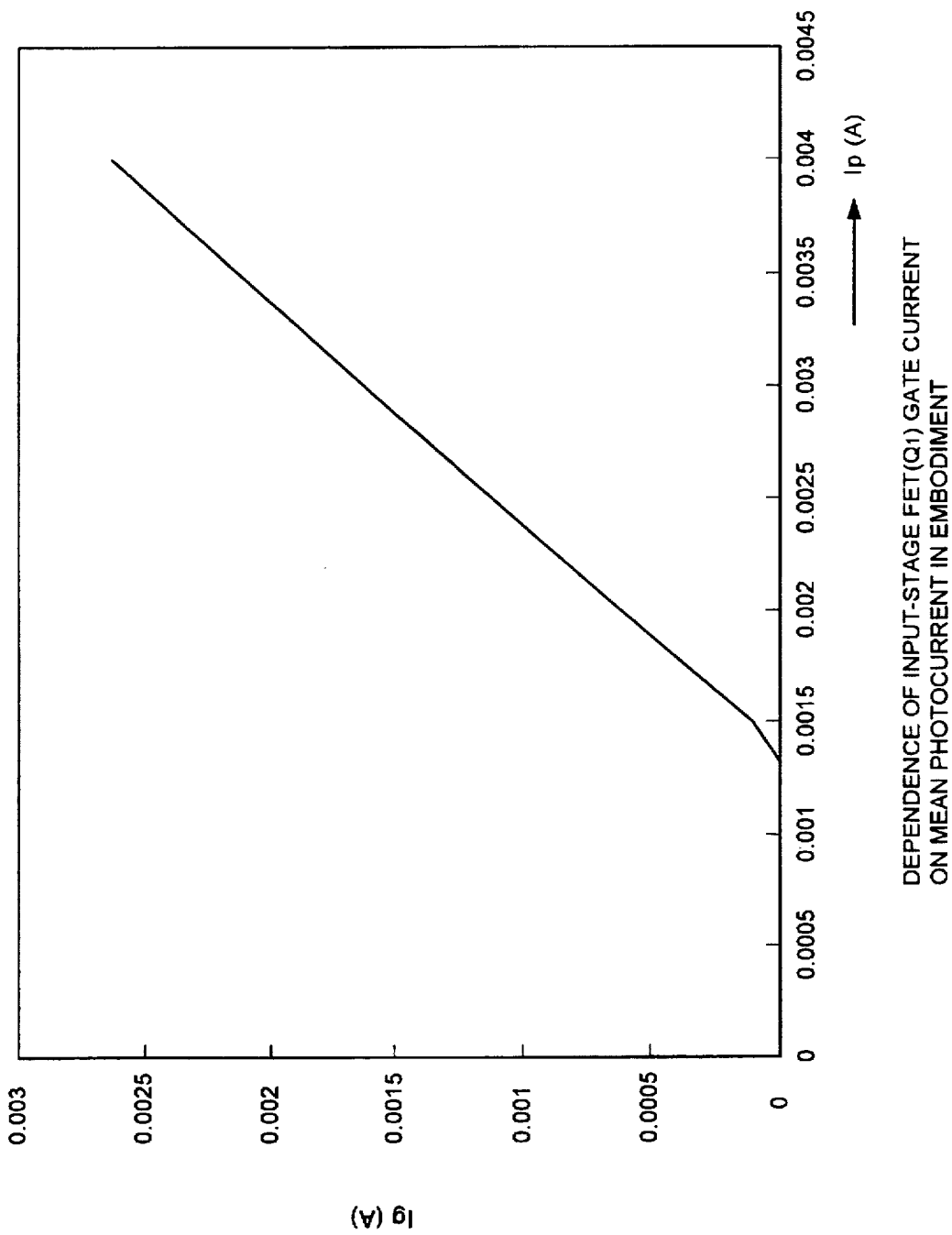
FIG. 12 is a graph showing the dependence of the gate current in an input-stage FET on mean photocurrent in the embodiment of the present invention.
Figure 13:
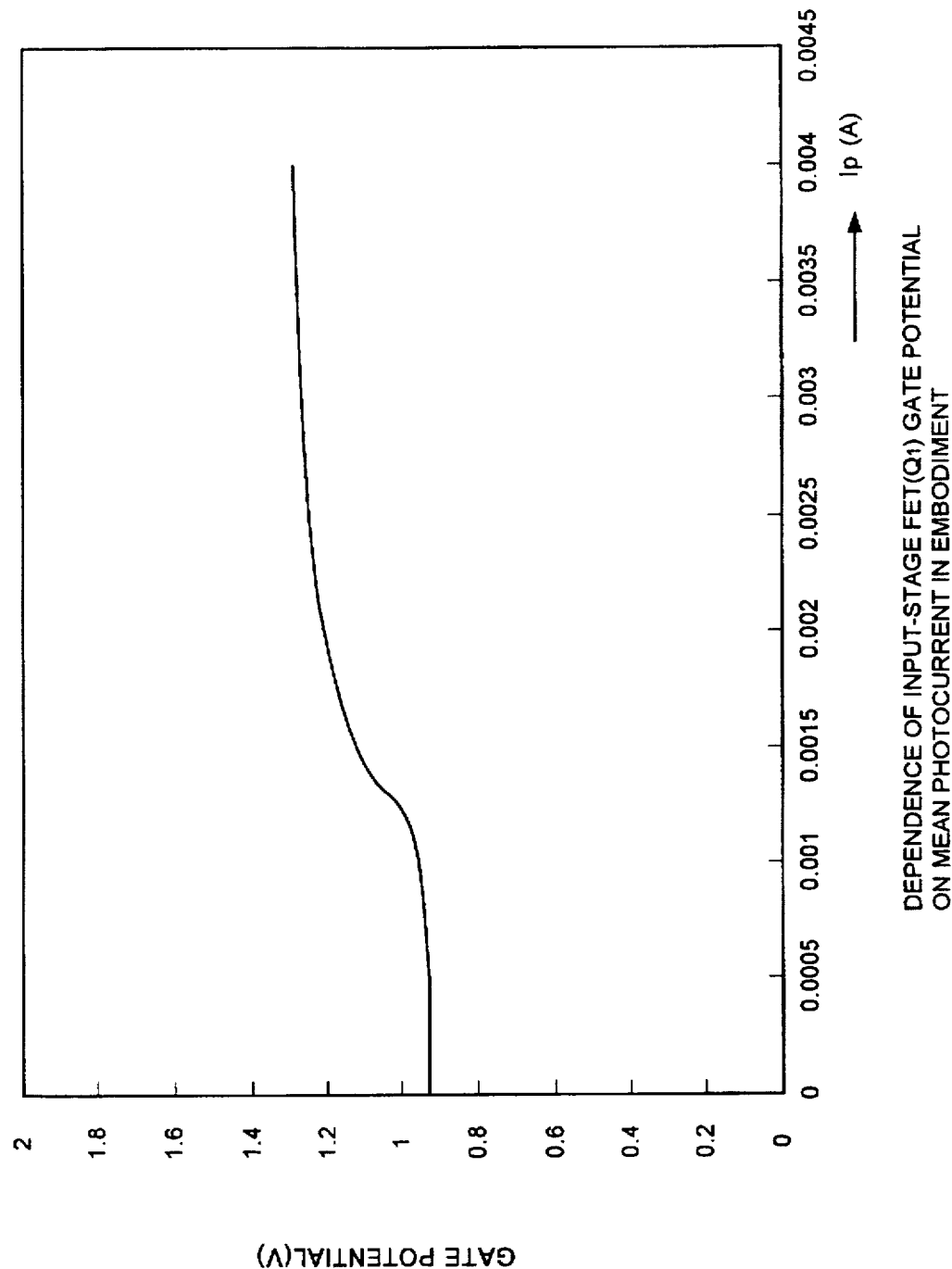
FIG. 13 is a graph showing the dependence of the gate potential in the input-stage FET on mean photocurrent in the embodiment of the present invention.

FIG. 12 shows changes in gate current of $Q_1$ with respect to mean incident light intensity (with its axis of abscissa indicating the photocurrent $i_p$), whereas FIG. 13 similarly shows changes in gate potential of $Q_1$. Since the gate of $Q_1$ has a Schottky diode characteristic and the source potential determined by the forward voltage of the diode D1, within the range in which the photocurrent is 4 mA (peak light intensity of 6.5 dBm or, in the case of a 50%-modulated signal, 3.5 dBm) or lower, the bias voltage $V_{gs}$ is about 0.65 V (=(the gate potential)−(the source potential))even when a considerably large amount of gate current is caused to flow. Accordingly, even when compared with a case in which the incident light intensity is low or a case in which there is no signal, the difference of the gate bias voltage between these two conditions is suppressed to 0.65−0.35=0.30 V or so.

In the present invention, the source potential of the FET $Q_1$ is important for preventing an unstable operation even in the case of a large optical input. Accordingly, it is preferable that the source electrode of $Q_1$ connected to a constant-voltage source or a forward diode having a constant voltage characteristic such as that shown in FIG. 2.

Figure 14:
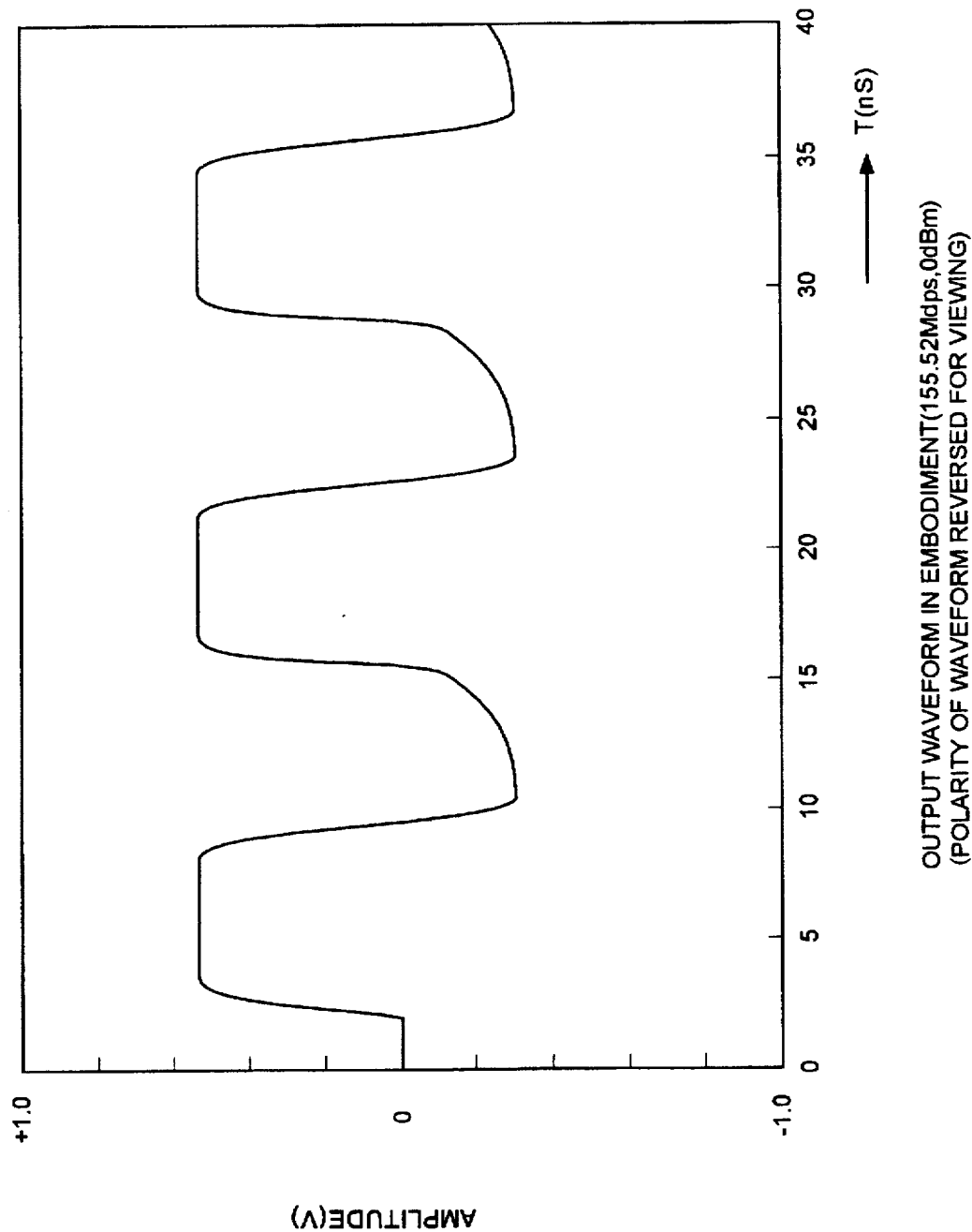
FIG. 14 is a graph showing an output waveform (155.52 Mbps, 0 dBm) of the preamplifier in the embodiment of the present invention.

FIG. 14 shows an output waveform of the preamplifier which was operated in a condition that the power supply voltage was 3.3 V and the temperature was 25° C., while a 1-0 signal at 155.52 Mbps and 0 dBm was input therein. It can be seen from the FIG. 14 that the distortion in waveform is small and that there is no problem at all even when an optical signal of 0 dBm is input therein.

Next, in order to confirm to what extent the low power supply voltage operation is possible in accordance with this embodiment, characteristics of a preamplifier which had a configuration equivalent to that shown in FIG. 1 except that all the FETs therein including $Q_1$ were constituted by D-FETs each having a threshold voltage of −400 mV were investigated. When this preamplifier was operated at a power supply voltage of +5.0 V, favorable characteristics, i.e., a voltage gain of 31 dB and 600 MHz bandwidth, were obtained. When the power supply voltage was lowered to +3.2 V, however, the preamplifier could not operate anymore. It could not operate until a power supply voltage higher than that of the present invention by at least 0.4 V.

It is due to the fact that the knee voltage (the critical point between the linear region and the saturation region in the $V_{ds}-I_{ds}$ characteristic of a FET) of E-FETs differs from that of D-FETs, whereby E-FETs exhibit a low knee voltage characteristic and are suitable for a low voltage operation. Further, the source potential of the input-stage FET determining the dynamic range of the output signal is provided by a voltage drop corresponding to a forward voltage of a single diode (about 0.6 V). Accordingly, in order to increase the dynamic range of the output signal, there may be: (1) a method in which an enormous amount of drain current (which should be about four times as large as the original drain current) is caused to flow into $Q_1$ so as to attain a large amount of the gate-source voltage $V_{gs}$ of $Q_1$ on the plus side, or (2) a method in which two forward diodes are connected to the source terminal of $Q_1$. Nevertheless, the method of (1) causes the current consumption to increase, whereas the method of (2) is disadvantageous to low voltage operation in that the circuit does not operate until the power supply voltage is further increased by an amount corresponding to the decrease in voltage of one diode. Neither of these methods yields superior characteristics the preamplifier in accordance with the present invention constituted essentially by an E-FET.

Thus, a preamplifier for optical communication which can stably operate even at a low power supply voltage while securing the dynamic range of its output signal is obtained when the input-stage FET of the preamplifier is constituted by an E-FET. Also, it has been confirmed that thus configured preamplifier can operate at a single power supply voltage of 2.8 V. Further realized by means of the E-FET is an operation in a small gate current which does not lower the sensitivity of the receiver and flows into the input-stage FET when the input signal is small, while part of the output current of the light receiving device is caused to flow into the gate of the input-stage FET as a bias current when the input signal is large. Thus, an enlarged dynamic range is obtained. Accordingly, as an optical receiver, a signal ranging from −36.5 dBm to 0 dBm or more at the maximum has been discernible with an error rate of $1\times10^{-1}$ or less.

Figure 15:
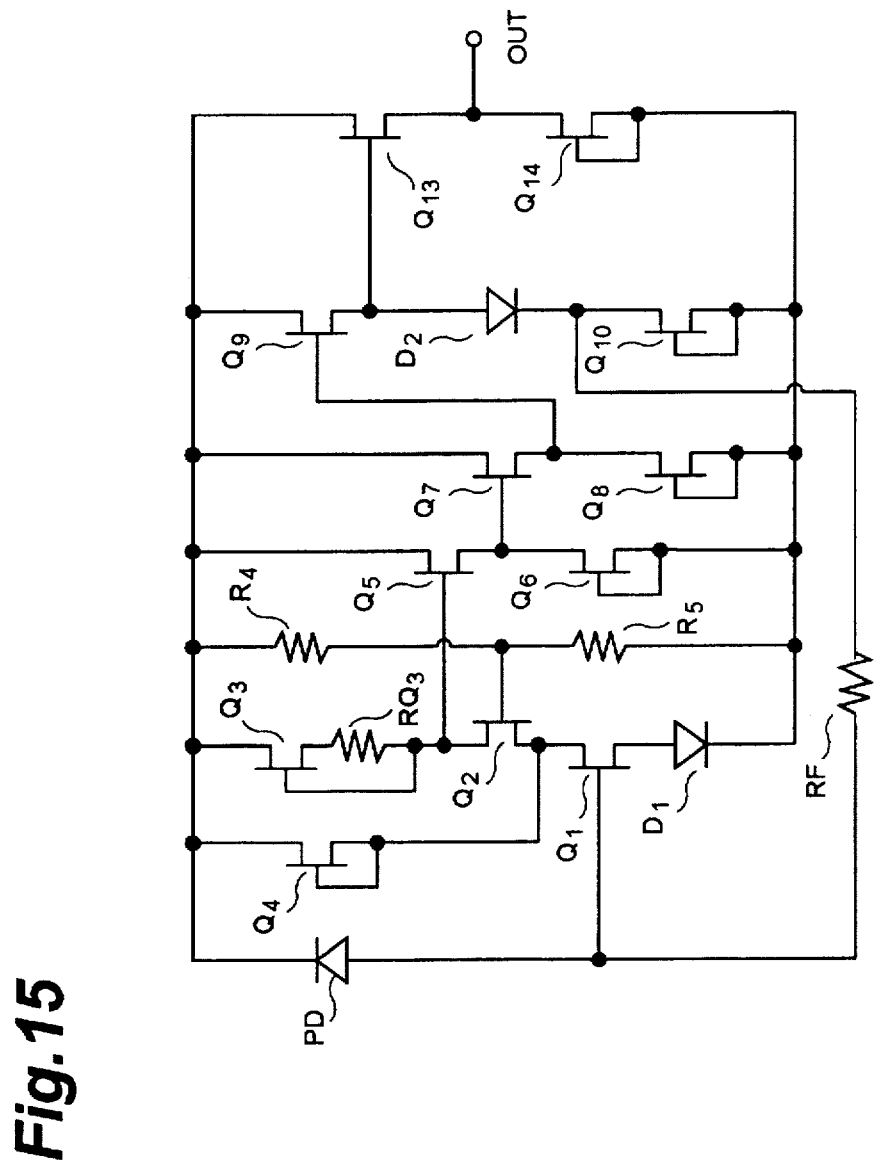
FIGS. 15 and 16 are circuit diagrams respectively showing modified examples of the embodiment shown in FIG. 1.

The application of the present invention should not be restricted to the foregoing embodiments. The present invention is applicable to a transimpedance amplifier using a known normal cascade connection shown in FIG. 15 in which no FET is connected in parallel to the feedback-resistor, a simple source-grounded amplifier, and the like. The threshold voltage of the E-FET can be adjusted in various manners without being restricted to +50 mV. As its material, not only GaAs-MESFET but also various materials such as Si-junction type FET (J-FET) and AlGaAs/GaAs or AlInAs/InGaAs HEMT can be used.

Figure 16:
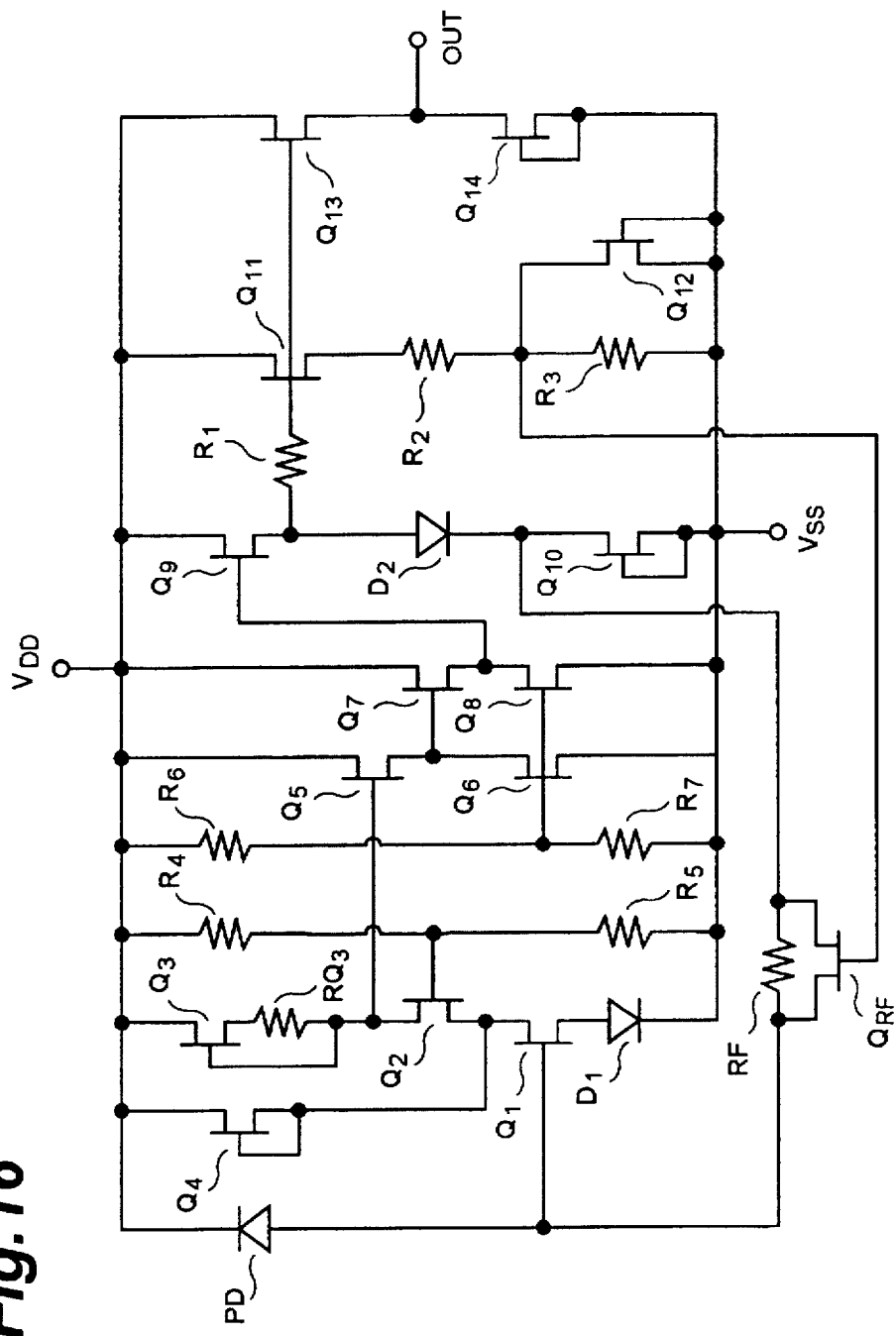

Also, as shown in FIG. 16, a circuit configuration may be such that $V_{DD}$ is divided by resistors so as to supply gate biases to FETs ($Q_6$ and $Q_8$) which function as source-follower current sources used for level-shifting.

As explained in the foregoing, in accordance with the present invention, the input-stage FET of the amplifier circuit in the preamplifier is constituted by an E-FET, and the gate potential of the E-FET is the sum of the gate bias $V_{gs}$ and source potential $V_s$. Accordingly, the preamplifier is operable even at a low power supply voltage while securing the dynamic range of its output signal. Further, the bias current can be caused to flow into the gate of the input-stage E-FET by an amount which does not lower the sensitivity of the receiver when the input signal is small, whereas part of the output current of the light receiving device can be caused to flow into the input-stage FET as a gate bias current when the input signal is large. Accordingly, a preamplifier for optical communication which is operable at a low power supply voltage and has a wide dynamic range can be obtained.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 036879/1996 filed on Feb. 23, 1996, and No. 068708/1996 filed on Mar. 25, 1996 are hereby incorporated by reference.

What is claimed is:

1. A preamplifier for optical communication for receiving a current signal from a light receiving device and converting thus received current signal into a voltage signal, said light receiving device receiving an optical signal and generating the current signal corresponding to said optical signal, said preamplifier comprising:

a first field effect transistor of an enhancement type having a gate terminal electrically connected to a terminal for receiving said current signal; and a source bias provider for setting a source terminal of said first field effect transistor to a potential being at least 0 V but not higher than +1 V with respect to a reference potential, wherein, when said preamplifier is operated, a voltage between said gate terminal and said source terminal is not lower than a threshold voltage of said first field effect transistor but not greater than 0.45V in a state of no optical input to said light receiving device.

2. A preamplifier according to claim 1, wherein said source bias provider comprises a diode, said diode having an anode terminal connected to the source terminal of said first field effect transistor and a cathode terminal set to said reference potential.

3. A preamplifier according to claim 1, wherein said source bias provider comprises a constant voltage source.

4. A preamplifier according to claim 1, further comprising:

a transimpedance control circuit for receiving an output-dependent signal corresponding to an output of said preamplifier and controlling a feedback amount to the gate terminal of said first field effect transistor; and a feedback circuit for outputting the feedback amount designated by said transimpedance control circuit toward the gate terminal of said first field effect transistor.

5. A preamplifier according to claim 4, wherein said feedback circuit comprises:

a feedback resistor having a first terminal set to the output-dependent voltage and a second terminal connected to the gate terminal of said first field effect transistor; and a second field effect transistor having a source terminal connected to the first terminal of said feedback resistor, a drain terminal connected to the second terminal of said feedback resistor, and a gate terminal for receiving a feedback amount control signal output from said transimpedance control circuit.

6. A preamplifier according to claim 1, further comprising an operating voltage input terminal which receives, as a single operating voltage, a voltage which is at least 2 V but not higher than 5 V with respect to said reference potential.

7. A preamplifier according to claim 1, wherein said first field effect transistor is a metal-semiconductor field-effect transistor mainly composed of GaAs.

8. A preamplifier according to claim 1, further comprising:

a second field effect transistor connected to the drain terminal of said first field effect transistor, said second field effect transistor having a gate terminal set at a fixed voltage level and a source terminal connected to the drain terminal of said first field effect, transistor; and a load circuit connected to a drain terminal of said second field effect transistor, wherein, when said preamplifier is operated, a voltage between the source terminal and gate terminal of said second field effect transistor is set to a voltage level at which said second field effect transistor is in a saturation region thereof in a state of no optical input to said light receiving device, while the voltage between the source terminal and the gate terminal of said second field effect transistor is set to a voltage level at which said second field effect transistor is in a linear region thereof has an intensity not lower than a predetermined level in a state of light input into said light receiving device.

9. A preamplifier according to claim 8, wherein said load circuit comprises a third field effect transistor.

10. A preamplifier according to claim 8, further comprising:

a transimpedance control circuit for receiving an output-dependent signal corresponding to an output of said preamplifier and controlling a feedback amount input to the gate terminal of said first field effect transistor; and a feedback circuit for outputting the feedback amount designated by said transimpedance control circuit toward the gate terminal of said first field effect transistor.

11. A preamplifier according to claim 10, wherein said feedback circuit comprises:

a feedback resistor having a first terminal set to the output-dependent voltage and a second terminal connected to the gate terminal of said first field effect transistor; and a fourth field effect transistor having a source terminal connected to the first terminal of said feedback resistor, a drain terminal connected to the second terminal of said feedback resistor, and a gate terminal for receiving a feedback amount control signal output from said transimpedance control circuit.

12. A preamplifier according to claim 11, wherein, as amount of light received by said light receiving device is increased, a level of the received light at which the voltage level between the drain and source terminals of said second field effect transistor begins to substantially change is substantially equal to a level of the received light at which a current begins to substantially flow between the drain and source terminals of said fourth field effect transistor.

* * * * *